(12) United States Patent
McCallion

(10) Patent No.: US 8,792,531 B2
(45) Date of Patent: *Jul. 29, 2014

(54) OPTICAL BEAM STEERING FOR TUNABLE LASER APPLICATIONS

(75) Inventor: Kevin J. McCallion, Charlestown, MA (US)

(73) Assignee: Finisar Corporation, Sunnyvale, CA (US)

(*) Notice: Subject to any disclaimer, the term of this patent is extended or adjusted under 35 U.S.C. 154(b) by 983 days.

This patent is subject to a terminal disclaimer.

(21) Appl. No.: 12/188,407

(22) Filed: Aug. 8, 2008

(65) Prior Publication Data

US 2008/0291950 A1 Nov. 27, 2008

Related U.S. Application Data

(63) Continuation-in-part of application No. 10/786,839, filed on Feb. 25, 2004, now Pat. No. 7,630,425.

(60) Provisional application No. 60/449,917, filed on Feb. 25, 2003, provisional application No. 60/463,063, filed on Apr. 15, 2003.

(51) Int. Cl.
*H01S 3/08* (2006.01)

(52) U.S. Cl.
USPC ............... 372/100; 372/50.12; 372/50.121; 372/50.122; 359/298; 359/831; 359/837

(58) Field of Classification Search
USPC ............... 372/100, 50.12, 50.121, 50.122; 359/298, 831, 837
See application file for complete search history.

(56) References Cited

U.S. PATENT DOCUMENTS

| 3,324,295 A | 6/1967 | Harris |
| 3,973,216 A | 8/1976 | Hughes et al. |
| 3,999,105 A | 12/1976 | Archey et al. |

(Continued)

FOREIGN PATENT DOCUMENTS

| CA | 2510352 | 3/2010 |
| CN | 1236891 | 12/1999 |

(Continued)

OTHER PUBLICATIONS

Alexander et al., Passive Equalization of Semiconductor Diode Laser Frequency Modulation, Journal of Lightwave Technology, Jan. 1989, 11-23, vol. 7, No. 1.

(Continued)

*Primary Examiner* — Tod T Van Roy
(74) *Attorney, Agent, or Firm* — Maschoff Brennan

(57) ABSTRACT

A transmitter is disclosed including a laser array comprising a plurality of lasers spatially offset from one another and each having a laser output having a unique wavelength. A first prism is positioned to impart a first angular shift to the laser outputs to produce and a second prism is positioned to impart a second angular shift opposite the first angular shift on the outputs. An index modulating element is coupled to one of the first and second prisms and a controller is electrically coupled to the index modulating element to control an angle of light output form the second prism. An optical spectrum reshaper may be positioned between the second prism and the lens and have at least one transmission edge aligned with the wavelength at least one of the lasers.

20 Claims, 7 Drawing Sheets

(56) References Cited

U.S. PATENT DOCUMENTS

| | | |
|---|---|---|
| 4,038,600 A | 7/1977 | Thomas et al. |
| 4,561,119 A | 12/1985 | Epworth |
| 4,671,604 A | 6/1987 | Soref |
| 4,754,459 A | 6/1988 | Westbrook |
| 4,805,235 A | 2/1989 | Henmi |
| 4,841,519 A | 6/1989 | Nishio |
| 4,896,325 A | 1/1990 | Coldren |
| 4,908,833 A | 3/1990 | Chraplyvy et al. |
| 4,914,667 A | 4/1990 | Blonder et al. |
| 5,088,097 A | 2/1992 | Ono et al. |
| 5,119,393 A | 6/1992 | Oka et al. |
| 5,136,598 A | 8/1992 | Weller et al. |
| 5,170,402 A | 12/1992 | Ogita et al. |
| 5,177,630 A | 1/1993 | Goutzoulis et al. |
| 5,212,710 A * | 5/1993 | Kaneda et al. ............ 372/71 |
| 5,293,545 A | 3/1994 | Huber |
| 5,305,134 A | 4/1994 | Tsushima et al. |
| 5,325,378 A * | 6/1994 | Zorabedian ............ 372/20 |
| 5,325,382 A | 6/1994 | Emura et al. |
| 5,371,625 A | 12/1994 | Wedding et al. |
| 5,394,429 A | 2/1995 | Yamada et al. |
| 5,412,474 A | 5/1995 | Reasenberg et al. |
| 5,416,629 A | 5/1995 | Huber |
| 5,434,693 A | 7/1995 | Tanaka et al. |
| 5,450,432 A | 9/1995 | Okuda |
| 5,459,799 A | 10/1995 | Weber |
| 5,465,264 A | 11/1995 | Buhler et al. |
| 5,477,368 A | 12/1995 | Eskildsen et al. |
| 5,550,667 A | 8/1996 | Krimmel et al. |
| 5,568,311 A | 10/1996 | Matsumoto |
| 5,592,327 A | 1/1997 | Gabl et al. |
| 5,642,371 A | 6/1997 | Tohyama et al. |
| 5,696,859 A | 12/1997 | Onaka et al. |
| 5,737,104 A | 4/1998 | Lee et al. |
| 5,777,773 A | 7/1998 | Epworth et al. |
| 5,805,235 A | 9/1998 | Bedard |
| 5,856,980 A | 1/1999 | Doyle et al. |
| 5,920,416 A | 7/1999 | Beylat et al. |
| 5,946,129 A | 8/1999 | Xu et al. |
| 5,953,139 A | 9/1999 | Nemecek et al. |
| 5,953,361 A | 9/1999 | Borchert |
| 5,974,209 A | 10/1999 | Cho et al. |
| 5,991,323 A | 11/1999 | Adams et al. |
| 6,018,275 A | 1/2000 | Perrett et al. |
| 6,081,361 A | 6/2000 | Adams et al. |
| 6,088,373 A | 7/2000 | Hakki |
| 6,091,743 A | 7/2000 | Yang |
| 6,096,496 A | 8/2000 | Frankel |
| 6,104,851 A | 8/2000 | Mahgerefteh |
| 6,115,403 A | 9/2000 | Brenner et al. |
| 6,148,017 A | 11/2000 | Borchert et al. |
| 6,157,025 A | 12/2000 | Katagiri et al. |
| 6,188,499 B1 | 2/2001 | Majima |
| 6,222,861 B1 | 4/2001 | Kuo et al. |
| 6,271,959 B1 | 8/2001 | Kim et al. |
| 6,282,003 B1 | 8/2001 | Logan et al. |
| 6,298,186 B1 | 10/2001 | He |
| 6,331,991 B1 | 12/2001 | Mahgerefteh |
| 6,351,585 B1 | 2/2002 | Amundson et al. |
| 6,353,623 B1 | 3/2002 | Munks |
| 6,359,716 B1 | 3/2002 | Taylor |
| 6,421,151 B1 | 7/2002 | Berger |
| 6,459,518 B1 | 10/2002 | Suzuki et al. |
| 6,473,214 B1 | 10/2002 | Roberts et al. |
| 6,486,440 B1 | 11/2002 | Crafts et al. |
| 6,506,342 B1 | 1/2003 | Frankel |
| 6,522,809 B1 | 2/2003 | Takabayashi et al. |
| 6,563,623 B1 | 5/2003 | Penninckx et al. |
| 6,577,013 B1 | 6/2003 | Glenn et al. |
| 6,580,739 B1 | 6/2003 | Coldren |
| 6,618,513 B2 | 9/2003 | Evankow, Jr. |
| 6,628,690 B1 | 9/2003 | Fish et al. |
| 6,650,667 B2 | 11/2003 | Nasu et al. |
| 6,654,564 B1 | 11/2003 | Colbourne et al. |
| 6,658,031 B2 | 12/2003 | Tuganov et al. |
| 6,665,351 B2 | 12/2003 | Hedberg et al. |
| 6,687,278 B1 | 2/2004 | Mason et al. |
| 6,690,686 B2 | 2/2004 | Delfyett |
| 6,738,398 B2 | 5/2004 | Hirata |
| 6,748,133 B2 | 6/2004 | Liu et al. |
| 6,778,307 B2 | 8/2004 | Clark |
| 6,785,308 B2 | 8/2004 | Dyer et al. |
| 6,807,215 B2 | 10/2004 | Lam et al. |
| 6,810,047 B2 | 10/2004 | Oh et al. |
| 6,815,786 B2 | 11/2004 | Ogasawara et al. |
| 6,834,134 B2 | 12/2004 | Brennan et al. |
| 6,836,487 B1 | 12/2004 | Farmer et al. |
| 6,847,758 B1 | 1/2005 | Watanabe |
| 6,943,951 B2 | 9/2005 | Kikuchi et al. |
| 6,947,206 B2 | 9/2005 | Tsadka et al. |
| 6,963,685 B2 | 11/2005 | Mahgerefteh et al. |
| 7,013,090 B2 | 3/2006 | Adachi et al. |
| 7,027,470 B2 | 4/2006 | May |
| 7,054,538 B2 | 5/2006 | Mahgerefteh et al. |
| 7,073,956 B1 | 7/2006 | Shin et al. |
| 7,076,170 B2 | 7/2006 | Choa |
| 7,123,846 B2 | 10/2006 | Tateyama et al. |
| 7,164,865 B2 | 1/2007 | Tatsuno et al. |
| 7,187,821 B2 | 3/2007 | Matsui et al. |
| 7,263,291 B2 | 8/2007 | Mahgerefteh et al. |
| 7,280,721 B2 | 10/2007 | McCallion et al. |
| 7,352,968 B2 | 4/2008 | Tayebati |
| 7,356,264 B2 | 4/2008 | Mahgerefteh et al. |
| 7,376,352 B2 | 5/2008 | Tayebati |
| 7,406,266 B2 | 7/2008 | Mahgerefteh et al. |
| 7,406,267 B2 | 7/2008 | Mahgerefteh et al. |
| 7,433,605 B2 | 10/2008 | Mahgerefteh et al. |
| 7,474,858 B2 | 1/2009 | Lee et al. |
| 7,474,859 B2 | 1/2009 | Mahgerefteh et al. |
| 7,477,851 B2 | 1/2009 | Mahgerefteh et al. |
| 7,480,464 B2 | 1/2009 | McCallion et al. |
| 7,492,976 B2 | 2/2009 | Mahgerefteh et al. |
| 7,502,532 B2 | 3/2009 | McCallion et al. |
| 7,505,694 B2 | 3/2009 | Johnson et al. |
| 7,515,626 B2 | 4/2009 | Lee et al. |
| 7,536,113 B2 | 5/2009 | Matsui et al. |
| 7,542,683 B2 | 6/2009 | Matsui et al. |
| 7,555,225 B2 | 6/2009 | Mahgerefteh et al. |
| 7,558,488 B2 | 7/2009 | Matsui et al. |
| 7,564,889 B2 | 7/2009 | Matsui et al. |
| 7,609,977 B2 | 10/2009 | Matsui et al. |
| 7,613,401 B2 | 11/2009 | Matsui et al. |
| 7,616,902 B2 | 11/2009 | Mahgerefteh et al. |
| 7,630,425 B2 | 12/2009 | Tayebati et al. |
| 7,639,955 B2 | 12/2009 | Zheng et al. |
| 7,657,179 B2 | 2/2010 | Mahgerefteh et al. |
| 7,663,762 B2 | 2/2010 | Mahgerefteh et al. |
| 7,697,186 B2 | 4/2010 | McCallion et al. |
| 7,697,847 B2 | 4/2010 | Matsui et al. |
| 7,742,542 B2 | 6/2010 | Mahgerefteh et al. |
| 7,760,777 B2 | 7/2010 | Matsui et al. |
| 7,778,295 B2 | 8/2010 | Matsui et al. |
| 7,809,280 B2 | 10/2010 | Mahgerefteh et al. |
| 7,860,404 B2 | 12/2010 | Matsui et al. |
| 7,869,473 B2 | 1/2011 | Ye et al. |
| 7,941,057 B2 | 5/2011 | Mahgerefteh et al. |
| 7,962,044 B2 | 6/2011 | McCallion et al. |
| 7,962,045 B2 | 6/2011 | McCallion et al. |
| 7,991,291 B2 | 8/2011 | Matsui et al. |
| 8,068,742 B2 | 11/2011 | Cole et al. |
| 2001/0012430 A1 | 8/2001 | Usami et al. |
| 2001/0048705 A1 | 12/2001 | Kitaoka et al. |
| 2002/0012369 A1 | 1/2002 | Nasu et al. |
| 2002/0044738 A1 | 4/2002 | Jablonski |
| 2002/0048290 A1 | 4/2002 | Tanaka et al. |
| 2002/0063930 A1 | 5/2002 | Blauvelt |
| 2002/0122256 A1 * | 9/2002 | Mitamura et al. ............ 359/577 |
| 2002/0131047 A1 | 9/2002 | Zarrabian et al. |
| 2002/0154372 A1 | 10/2002 | Chung et al. |
| 2002/0159490 A1 | 10/2002 | Karwacki |
| 2002/0176659 A1 | 11/2002 | Lei et al. |
| 2003/0002099 A1 | 1/2003 | Sayyah et al. |
| 2003/0002120 A1 | 1/2003 | Choa |
| 2003/0063647 A1 | 4/2003 | Yoshida et al. |

(56) References Cited

U.S. PATENT DOCUMENTS

| | | |
|---|---|---|
| 2003/0067952 A1 | 4/2003 | Tsukiji et al. |
| 2003/0077031 A1 | 4/2003 | Zhang et al. |
| 2003/0099018 A1 | 5/2003 | Singh et al. |
| 2003/0147114 A1 | 8/2003 | Kang et al. |
| 2003/0161370 A1 | 8/2003 | Buimovich et al. |
| 2003/0169787 A1 | 9/2003 | Vurgaftman et al. |
| 2003/0193974 A1 | 10/2003 | Frankel et al. |
| 2003/0210912 A1 | 11/2003 | Leuthold |
| 2004/0008933 A1 | 1/2004 | Mahgerefteh et al. |
| 2004/0008937 A1 | 1/2004 | Mahgerefteh et al. |
| 2004/0036943 A1 | 2/2004 | Freund et al. |
| 2004/0076199 A1 | 4/2004 | Wipiejewski et al. |
| 2004/0081386 A1 | 4/2004 | Morse et al. |
| 2004/0086012 A1 | 5/2004 | Kitaoka et al. |
| 2004/0096221 A1 | 5/2004 | Mahgerefteh et al. |
| 2004/0109698 A1 | 6/2004 | Kim et al. |
| 2004/0218890 A1 | 11/2004 | Mahgerefteh et al. |
| 2004/0234200 A1 | 11/2004 | Jennings et al. |
| 2005/0074244 A1 | 4/2005 | Roberts et al. |
| 2005/0100345 A1 | 5/2005 | Welch et al. |
| 2005/0111852 A1 | 5/2005 | Mahgerefteh et al. |
| 2005/0152702 A1 | 7/2005 | Mahgerefteh et al. |
| 2005/0163512 A1 | 7/2005 | Tayebati et al. |
| 2005/0169638 A1 | 8/2005 | Tayebati et al. |
| 2005/0169642 A1 | 8/2005 | Mahgerefteh et al. |
| 2005/0175356 A1 | 8/2005 | McCallion et al. |
| 2005/0196177 A1 | 9/2005 | Moran |
| 2005/0206989 A1 | 9/2005 | Marsh |
| 2005/0213993 A1 | 9/2005 | Kazemi-Nia et al. |
| 2005/0249509 A1 | 11/2005 | Nagarajan et al. |
| 2005/0265733 A1 | 12/2005 | Kao et al. |
| 2005/0271394 A1 | 12/2005 | Whiteaway et al. |
| 2005/0286829 A1 | 12/2005 | Mahgerefteh et al. |
| 2005/0286909 A1 | 12/2005 | Kish, Jr. et al. |
| 2006/0002718 A1 | 1/2006 | Matsui et al. |
| 2006/0008272 A1 | 1/2006 | Abeles et al. |
| 2006/0018666 A1 | 1/2006 | Matsui et al. |
| 2006/0029358 A1 | 2/2006 | Mahgerefteh et al. |
| 2006/0029396 A1 | 2/2006 | Mahgerefteh et al. |
| 2006/0029397 A1 | 2/2006 | Mahgerefteh et al. |
| 2006/0078336 A1 | 4/2006 | McNicol et al. |
| 2006/0078338 A1 | 4/2006 | Johnson et al. |
| 2006/0120416 A1 | 6/2006 | Hu et al. |
| 2006/0193636 A1 | 8/2006 | Katagiri et al. |
| 2006/0228120 A9 | 10/2006 | McCallion et al. |
| 2006/0233556 A1 | 10/2006 | Mahgerefteh et al. |
| 2006/0239306 A1 | 10/2006 | Donanhoe |
| 2006/0274993 A1 | 12/2006 | Mahgerefteh et al. |
| 2007/0064759 A1 | 3/2007 | Kobayashi et al. |
| 2007/0286608 A1 | 12/2007 | Matsui et al. |
| 2008/0002990 A1 | 1/2008 | McCallion et al. |
| 2008/0037608 A1 | 2/2008 | Zhou et al. |
| 2008/0159747 A1 | 7/2008 | Mahgerefteh et al. |
| 2008/0166134 A1 | 7/2008 | McCallion et al. |
| 2008/0181619 A1 | 7/2008 | Heismann |
| 2008/0187325 A1 | 8/2008 | McCallion et al. |
| 2008/0193132 A1 | 8/2008 | Matsui et al. |
| 2008/0193144 A1 | 8/2008 | Zhou et al. |
| 2008/0240180 A1 | 10/2008 | Matsui et al. |
| 2008/0247763 A1 | 10/2008 | Mahgerefteh et al. |
| 2008/0247765 A1 | 10/2008 | Mahgerefteh et al. |
| 2009/0003842 A1 | 1/2009 | Mahgerefteh et al. |
| 2009/0060526 A1 | 3/2009 | Matsui et al. |
| 2009/0080905 A1 | 3/2009 | Olsson |
| 2009/0196631 A1 | 8/2009 | Daghighian et al. |
| 2009/0238224 A1 | 9/2009 | Ye |
| 2009/0269069 A1 | 10/2009 | Mahgerefteh et al. |
| 2010/0008679 A1 | 1/2010 | Cole |
| 2010/0098436 A1 | 4/2010 | Mahgerefteh et al. |
| 2010/0279447 A1 | 11/2010 | Matsui et al. |
| 2010/0311195 A1 | 12/2010 | Matsui et al. |

FOREIGN PATENT DOCUMENTS

| | | |
|---|---|---|
| CN | 200380108289.9 | 11/2007 |
| CN | 200380108289.9 | 8/2008 |
| CN | 200380108289.9 | 11/2008 |
| CN | 200580015245.0 | 9/2009 |
| CN | 200580012705.4 | 3/2010 |
| CN | 200580015245.0 | 3/2010 |
| CN | 2005800378071 | 5/2010 |
| CN | 200880009551.7 | 7/2010 |
| EP | 0524758 | 7/1992 |
| EP | 602659 | 6/1994 |
| EP | 05731268.8 | 1/2008 |
| EP | 05764209.2 | 6/2009 |
| EP | 05731268.8 | 5/2010 |
| GB | 2 107 147 | 4/1983 |
| JP | 58-075340 | 5/1983 |
| JP | 62-189832 | 8/1987 |
| JP | 09-214427 | 8/1997 |
| JP | 11-031859 | 2/1999 |
| JP | 2000105313 | 4/2000 |
| JP | 2001-036477 | 2/2001 |
| JP | 2001-284711 | 10/2001 |
| JP | 2001291928 | 10/2001 |
| JP | 2001320328 | 11/2001 |
| JP | 2002243935 | 8/2002 |
| JP | 2002267834 | 9/2002 |
| JP | 2002267998 | 9/2002 |
| JP | 2002-311235 | 10/2002 |
| JP | 2004-551835 | 7/2008 |
| JP | 2004-551835 | 3/2010 |
| JP | 2009-504345 | 4/2010 |
| JP | 2009-504345 | 10/2010 |
| KR | 102008-7027139 | 4/2010 |
| WO | 9905804 | 2/1999 |
| WO | 0104999 | 1/2001 |
| WO | WO 0117076 | 3/2001 |
| WO | WO 0118919 | 3/2001 |
| WO | 03005512 | 7/2002 |

OTHER PUBLICATIONS

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Hyryniewicz, J.V., et al., Higher Order Filter Response in Coupled Microring Resonators, IEEE Photonics Technology Letters, Mar. 2000, 320-322, vol. 12, No. 3.

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in Microring Resonators, Integrated Photonics Research Conference 2003.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutal et al., On the Various Time Constants of Wavelength Changes of A DFB Laser Under Direct Modulation, IEEE Journal of Quantum Electronics, Oct. 1998, pp. 1816-1822, vol. 34, No. 10.

(56) References Cited

OTHER PUBLICATIONS

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

Matsui, Yasuhiro et al, Chirp-Managed Directly Modulated Laser (CML), IEEE Photonics Technology Letters, Jan. 15, 2006, pp. 385-387, vol. 18, No. 2.

Nakahara, K. et al, 40-Gb/s Direct Modulation With High Extinction Ratio Operation of 1.3-μm InGaA 1 as Multiquantum Well Ridge Waveguide Distributed Feedback Lasers, IEEE Photonics Technology Letters, Oct. 1, 2007, pp. 1436-1438, vol. 19 No. 19.

Sato, K. et al, Chirp Characteristics of 40-Gb/s Directly Modulated Distributed-Feedback Laser Diodes, Journal of Lightwave Technology, Nov. 2005, pp. 3790-3797, vol. 23, No. 11.

Dischler et al., Experimental Assessment of a Direct Detection Optical OFDM System Targeting 10Gb/s and Beyond, Optical Fiber Communication/National Fiber Optic Engineers Conference, Feb. 24-28, 3 pages, San Diego, CA.

Dong Jae Shin, et al., Low-cost WDM-PON with Colorless Bidirectional Tranceivers, Journal of Lightwave Technology, Jan. 2006, pp. 158-165, vol. 24, No. 1.

Freund et al, 30 Gbit/s RZ 8-PSK Transmission over 2800 km Standard Single Mode Fibre without Inline dispersion Compensation, 2007, 3 pages.

Kikuchi, Nobuhiko et al., Experimental Demonstration of Incoherent Optical Multilevel Staggered-APSK (Amplitude- and Phase-Shift Keying) Signaling, Optical Fiber Communication/National Fiber Optic Engineers Conference, Feb. 24-28, 2008, 3 pages, San Diego, CA.

Kiyoshi Fukuchi, Proposal and Feasibility Study of a 6-level PSK modulation format based system for 100 Gg/s migration, 2007, 3 pages.

Lammert et al., MQW DBR Lasers with Monolithically Integrated External-Cavity Electroabsorption Modulators Fabricated Without Modification of the Active Region, IEEE Photonics Technology Letters, vol. 9, No. 5, May 1997, pp. 566-568.

Mahgerefteh, D. and Fan, F., Chirp-managed-laser technology delivers > 250-km reach, Lightwave Online, 2005, PennWell Corporation. Accessed online Jul. 1, 2009 at: http://www.finisar.com/download_31wMeaCML_Application%20White%20Paper-LW.pdf.

Mahgerefteh et al., Chirp managed laser (CML): A compact transmitter for dispersion tolerant 10 Gb/s networking applications; Optical Fiber Communication Conference, 2006 and the 2006 National Fiber Optic Engineers Conference. OFC 2006, Mar. 5-10, 2006; Digital Object Identifier: 10.1109/OFC.2006.215459.

Sekine, Kenro et al., Advanced Multi-level Transmission Systems, Optical Fiber Communication/National Fiber Optic Engineers Conference, Feb. 24-28, 2008, 3 pages, San Diego, CA.

Tokle, Torger et al., Advanced Modulation Formats for Transmission Systems, Optical Fiber Communication/National Fiber Optic Engineers Conference, Feb. 24-28, 2008, 3 pages, San Diego, CA.

Wesstrom et al., State-of-the-art performance of widely tunable modulated grating Y-branch lasers; Optical Fiber Communiation Conference, 2004. OFC 2004, vol. 1, no., pp. 2 vol. (1800), Feb. 23-27, 2004; doi: 10.1109/OFC.2004.1349295.

U.S. Appl. No. 11/964,315, Aug. 25, 2010, Office Action.
U.S. Appl. No. 11/964,315, Feb. 4, 2011, Notice of Allowance.
U.S. Appl. No. 11/964,321, Aug. 25, 2010, Office Action.
U.S. Appl. No. 11/964,321, Dec. 29, 2010, Notice of Allowance.
U.S. Appl. No. 12/014,676, Oct. 4, 2010, Office Action.
U.S. Appl. No. 12/014,676, Mar. 18, 2011, Notice of Allowance.
U.S. Appl. No. 12/017,957, Nov. 5, 2010, Office Action.
U.S. Appl. No. 12/017,957, Apr. 25, 2011, Office Action.
U.S. Appl. No. 12/025,573, Oct. 6, 2010, Office Action.
U.S. Appl. No. 12/028,675, Oct. 27, 2010, Office Action.
U.S. Appl. No. 12/028,675, Mar. 24, 2011, Notice of Allowance.
U.S. Appl. No. 12/028,678, Dec. 8, 2010, Office Action.
U.S. Appl. No. 12/028,678, May 6, 2011, Notice of Allowance.
U.S. Appl. No. 12/047,017, Jun. 1, 2010, Restriction Requirement.
U.S. Appl. No. 12/047,017, Aug. 6, 2010, Office Action.
U.S. Appl. No. 12/047,017, Sep. 27, 2010, Notice of Allowance.
U.S. Appl. No. 12/053,344, Apr. 1, 2010, Office Action.
U.S. Appl. No. 12/053,344, Sep. 3, 2010, Notice of Allowance.
U.S. Appl. No. 12/115,337, Mar. 4, 2010, Office Action.
U.S. Appl. No. 12/115,337, Aug. 20, 2010, Office Action.
U.S. Appl. No. 12/115,337, Oct. 28, 2010, Notice of Allowance.
U.S. Appl. No. 12/184,137, Dec. 2, 2010, Notice of Allowance.
U.S. Appl. No. 12/839,310, Apr. 28, 2011, Ex Parte Quayle Action.
U.S. Appl. No. 12/566,471, Jan. 20, 2011, Office Action.
U.S. Appl. No. 12/126,717, Apr. 7, 2011, Office Action.
U.S. Appl. No. 12/110,071, May 12, 2011, Office Action.
U.S. Appl. No. 12/014,676 Supplemental Notice of Allowance mailed Jun. 29, 2011.
U.S. Appl. No. 12/025,573 Notice of Allowance mailed Feb. 7, 2011.
U.S. Appl. No. 12/126,717 Office Action mailed Apr. 7, 2011.
U.S. Appl. No. 12/566,471 Office Action mailed Jul. 27, 2011.
U.S. Appl. No. 12/017,957, Oct. 26, 2011, Notice of Allowance.
U.S. Appl. No. 12/126,717, Sep. 12, 2011, Office Action.
U.S. Appl. No. 12/839,310, Sep. 27, 2011, Office Action.
U.S. Appl. No. 12/566,471, Dec. 5, 2011, Notice of Allowance.
U.S. Appl. No. 12/857,465, Nov. 18, 2011, Office Action.
U.S. Appl. No. 12/171,201, Jul. 19, 2011, Notice of Allowance.

* cited by examiner

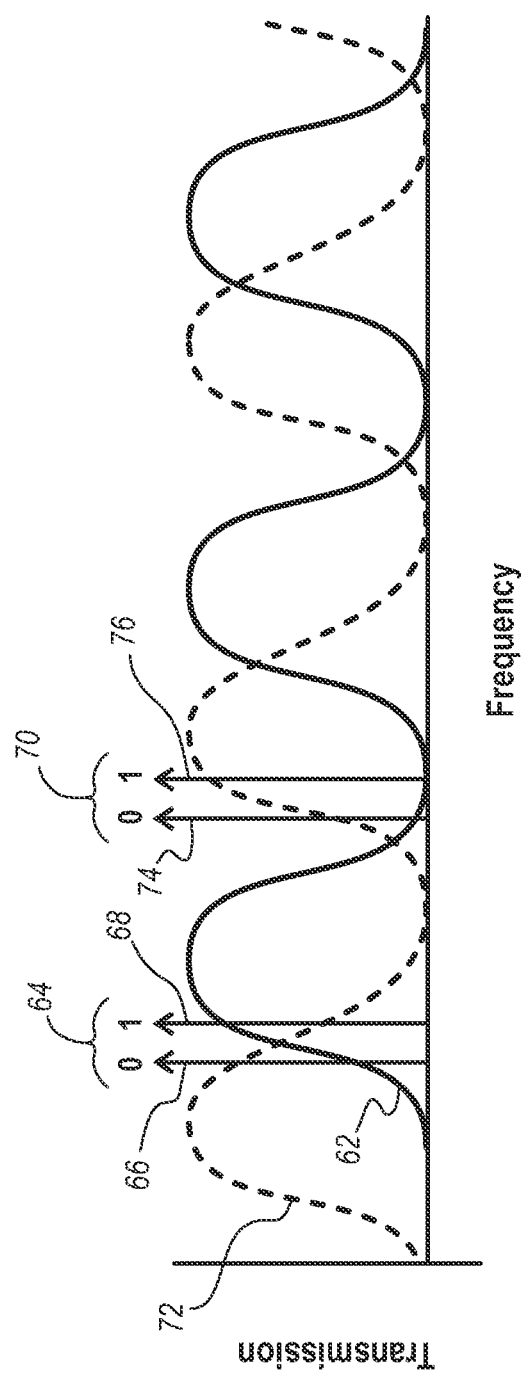

OPTICAL BEAM STEERING FOR TUNABLE LASER APPLICATIONS

CROSS-REFERENCE TO RELATED APPLICATIONS

This application is a continuation-in-part of U.S. patent application Ser. No. 10/786,839, filed Feb. 25, 2004.

BACKGROUND OF THE INVENTION

1. The Field of the Invention

This invention has applications in telecommunications and spectroscopy

2. The Relevant Technology

The emergence of DWDM technology as a viable solution to bandwidth bottlenecks in current and future optical networks has generated a need for spectrally tunable optical components. In particular, tunable laser sources that can be deployed along with high speed, intensity modulator components are required. Several different technologies and approaches have been adopted in an effort to provide a low-cost, high performance, tunable laser sources that meet the specifications called for by today's network operators.

A number of tunable laser implementations make use of micro-electro-mechanical systems (MEMS) for their successful operation. These include ECLs and DFB arrays where a mechanical adjustment allows selection of the desired laser wavelength. The DFB array approach has particular attractions in that well-understood, reliable DFB laser technology is used, albeit in array form. In this implementation, up to 12 DFBs are fabricated on the same chip with a separation of around 10 μm between adjacent lasers. The center wavelength, at fixed temperature, is offset by approximately 3 nm between adjacent lasers and each laser can be temperature tuned to cover 3 nm. Thus, full C band tuning can be realized by selectively tuning the lasers within their local thermal range and switching to the adjacent laser as required.

However, the spatial offset of the individual lasers within the array makes efficient coupling to a single optical fiber difficult. A single lens can be used to collect and collimate the light from each of the DFB laser sources but the spatial offset results in a varying angle on the collimated beam. This leads to a spatial offset when the beams are focused onto a single optical fiber that is located in a fixed position in the focal plane of a second lens. Thus, efficient coupling can only be obtained for the DFB laser at the center of the array.

The above situation can be remedied by incorporating a beam steering element in the optical path between a collimating lens and a focus lens. Typically, this could be a MEMS mirror that can be electrostatically tuned via application of a control voltage. This approach suffers from vibration issues that are known to plague MEMS type implementations.

As a result, one object of this invention is to provide a low cost, low power consumption, multiplexing solution to coupling of an array of DFB lasers (spatially and spectrally offset). The described approach removes the need for a complicated MEMS beam steering mirror and reduces sensitivity to vibration effects, etc.

BRIEF SUMMARY OF THE INVENTION

In one aspect of the invention an optical transmitter includes a laser array comprising a plurality of lasers spatially offset from one another and each having a laser output having a unique wavelength. A first prism is positioned to impart a first angular shift to the laser outputs to produce first angularly shifted outputs. A second prism is positioned to impart a second angular shift to the first angularly shifted outputs to produce second angularly shifted outputs. The second angular shift is in a direction opposite the first angular shift. An output lens is positioned to receive a first output of the second angularly shifted outputs incident on the lens. An index modulating element is coupled to one of the first and second prisms and a controller is electrically coupled to the index modulating element. The controller is programmed to selectively power the index modulating element an amount effective to alter one of the first and second angular shifts sufficiently to cause a second output of the second angularly shifted outputs to be incident on the lens.

In another aspect of the invention, an optical spectrum reshaper is positioned between the second prism and the lens. The optical spectrum reshaper has at least one transmission edge aligned with the wavelength at least one of the lasers.

In another aspect of the invention the transmitter includes an array of first photodiodes and a second photodiode. A tap splitter is positioned between the second prism and the optical spectrum reshaper and is configured to divert a portion of the second angularly shifted outputs onto the array of first photodiodes and configured to divert a portion of light reflected from the optical spectrum reshaper onto the second photodiode. The controller is electrically coupled to the array of first photodiodes and is programmed to control power supplied to the index modulating element according to outputs of the array of first photodiodes. The controller is also electrically coupled to the plurality of lasers and operable to control the wavelengths of the plurality of lasers according to a ratio of an output of the second photo diode and a combination of the outputs of the array of first photodiodes.

These and other features of the present invention will become more fully apparent from the following description and appended claims, or may be learned by the practice of the invention as set forth hereinafter.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein:

FIG. 7 is a graph illustrating the transmission function of an optical spectrum reshaper relative to base and peak frequencies of a frequency modulated signal in accordance with an embodiment of the present invention.

DETAILED DESCRIPTION OF THE PREFERRED EMBODIMENTS

As described by the present invention, a thermally tuned beam steering element can be used in the optical path. A prism fabricated from a thermo-optic material can effectively act as an optical beam steering element by controlling the temperature. This beam steering element can be incorporated into various optical subassemblies to provide improved functionality e.g. wavelength tunable lasers.

This approach allows lower cost and simpler implementation while avoiding vibration-induced detrimental effects.

Figure 1:
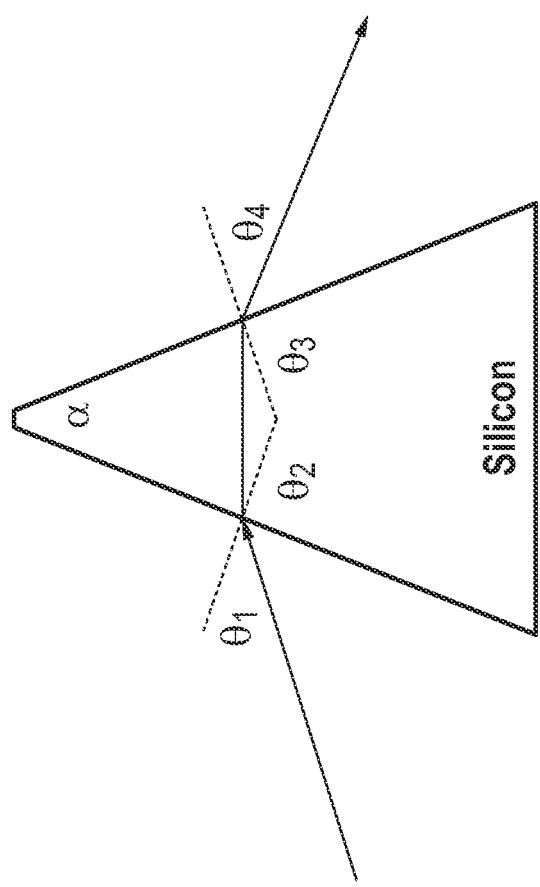
FIG. 1 is a schematic diagram of a prism beam steering element.

More particularly, by inserting a prism into the collimated beam path, it is possible to vary the angle of the beam by changing the refractive index of the prism material. Preferably, this can be done in an isotropic fashion by using a high dn/dT material such as a crystalline semiconductor such as Silicon, Gallium Arsenide or Indium Phosphide. Silicon is particularly convenient due to its ease of processing and low optical loss in the 1550 nm region when in pure, un-doped crystalline form. FIG. 1 shows the beam steering function of the prism.

It can be shown that the following equation holds for the prism beam steering function:

$$\sin \theta_4 = \sin \alpha \sqrt{n^2 \sin^2 \theta_1} - \cos \alpha \sin \theta_1$$

The above equation shows that the exit angle of the beam is dependent on the input angle, the prism angle and the refractive index of the prism material. For practical use, the refractive index can be varied via the thermo-optic effect. As an example, the graph shown in FIG. 2 shows a plot of the output angle variation that can be achieved via temperature control of the prism.

Figure 2:
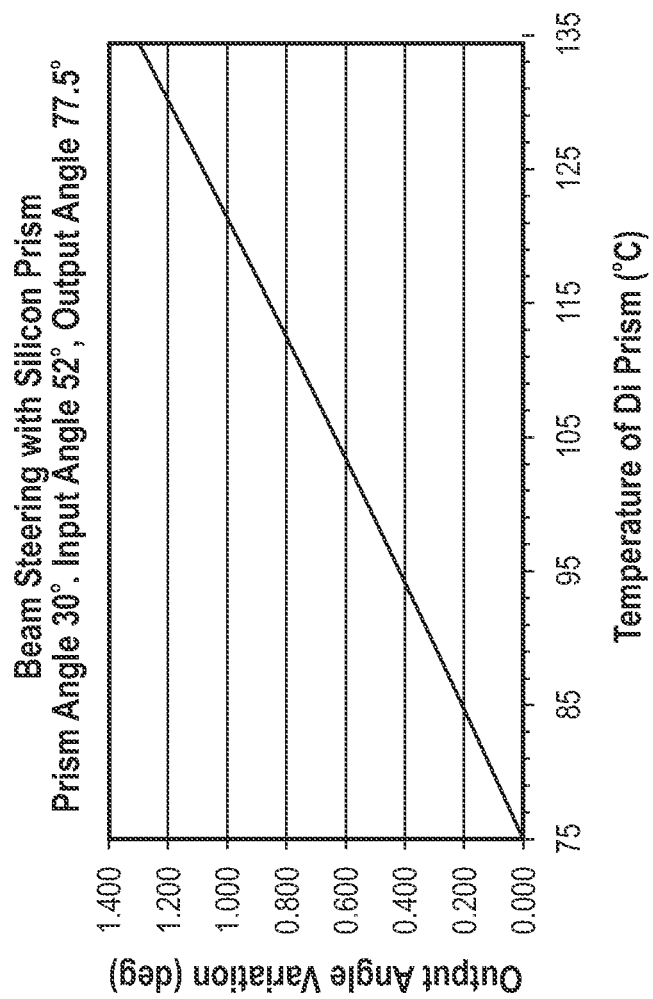
FIG. 2 is a graph showing temperature induced beam steering.

FIG. 2 shows that a significant amount of beam steering can be achieved for around 50° C. of temperature variation. However, the beam size and shape (and aberration) is also affected by the prism and should be considered in a practical design/implementation.

Upon passing through the prism interfaces, the beam width in the horizontal direction is magnified according to the equation below:

$$M = \frac{\cos\theta_2}{\cos\alpha\theta_1} \frac{\cos\theta_4}{\cos\theta_3}$$

where the angles are defined as in FIG. 1.

Passing the beam through the steering prism causes aberration and beam quality degrades, leading to a reduction in fiber coupling efficiency. This problem can be avoided by passing the beam through a second "correction" prism to "undo" the aberration. This restores the original optical beam shape and quality but the beam angle variation still remains. The design of the second "correction" prism (located either before or after the diffraction grating) can be arranged that it corrects for aberration induced by the steering prism plus aberration/beam shaping induced by the grating itself.

A typical implementation uses crystalline Silicon as the prism material with anti-reflection coatings on the interacting surfaces. Temperature control of the prism is efficiently achieved by mounting the prism onto a thermally insulative base that has been patterned with a metal strip heater. A thermistor is located on the top surface of the prism to allow temperature monitoring and feedback. The power consumption can be minimized by keeping the dimensions of the prism as small as possible for the given optical beam size. Angles of incidence and exit also have an impact on possible prism dimensions.

Other potential component implementations can be developed based on the optical beam steering element. These include variable optical attenuators, beam shutters, tunable filters, and other external cavity laser designs (using SOA as gain medium).

A preferred embodiment that uses the optical beam steering element is in a tunable laser design that is based on a DFB laser array.

Figure 3:
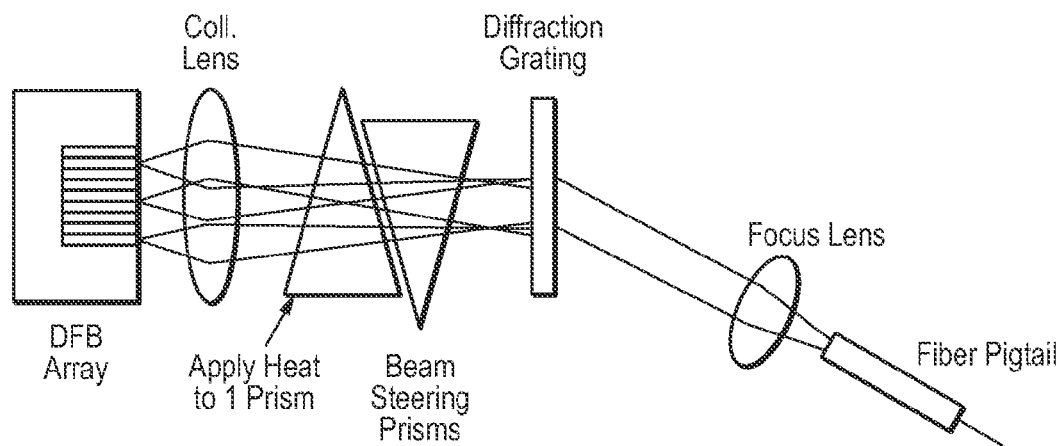
FIG. 3 is a schematic diagram showing a tunable laser based on a DFB array, beam steering prism and diffraction grating (transmission, reflection grating or hologram)(each DFB laser is thermally tuned over 400 GHz)

An optical beam steering approach as applied to a tunable laser based on a DFB array is shown in FIG. 3.

The principle of operation is based on spatial multiplexing of the light emitted by each individual DFB array element (different emission wavelengths) using the diffraction grating. The grating is designed to multiplex the array elements for a set condition of wavelengths and array pitch. The function of the beam steering prism is to compensate for the shift in wavelength when each DFB array element is tuned by varying the temperature of the laser.

From FIG. 3, the offset of the DFB array elements from the center element results in a slight beam angle after the collimation lens, with respect to the center element. Typically, for an array pitch of 10 um and array size of 12 DFB lasers, the elements at the extremes of the array are physically separated from the center element by 50 μm. For an even number of elements on a 10 μm pitch, there is a further 5 μm offset from the spatial center of the array. Therefore, the outlying DFB elements are 55 μm from geometrical center. If a 3 mm focal length collimating lens is used, the approximate angle of the collimated beams relative to the optical axis of the lens, is given by $\tan(\theta)=55/3000$ with $\theta=1.05°$. For adjacent DFB elements, the resultant angular dispersion is $\delta\lambda/\delta\theta=3$ nm/tan⁻¹(10/3000)=900 nm/rad.

The DFB array is designed such that the emission wavelength of each element is offset from its nearest neighbor by 3 nm. Thus, a 12 DFB array can cover a spectral range of 36 nm, assuming that each individual element is capable of tuning 3 nm via temperature variation. The spatial (resulting in beam angle) and spectral offset between adjacent array elements can be used to design a grating that compensates for the beam angle induced by the collimating lens.

The invention can be implemented using a range of diffraction grating options: (1) transmission type, (2) reflection type, or (3) hologram type. Types 1 and 2 are generally surface relief style geometries. Type 3 is fabricated by inducing spatially-dependent refractive index changes within a transparent material (often a crystalline material).

The well-known equation for a grating is:

$$m\lambda = d(\sin \alpha + \sin \beta) \quad (1)$$

where m is the diffracted order, $\lambda$ is the incident wavelength, d is the spacing between adjacent grooves on the grating surface, $\alpha$ is the angle of incidence and $\beta$ is the diffracted angle.

For the arrangement shown in FIG. 3, the incident angle is normal to the grating and the equation above collapses to:

$$m\lambda = d \sin \beta \quad (2)$$

To perform the necessary multiplexing function required as described above, the angular dispersion of the grating should satisfy the relation below:

$$\frac{\delta\lambda}{\delta\beta} = \frac{d}{m}\cos\beta = 900 \qquad (3)$$

where units are in nm/rad.

Figure 3A:
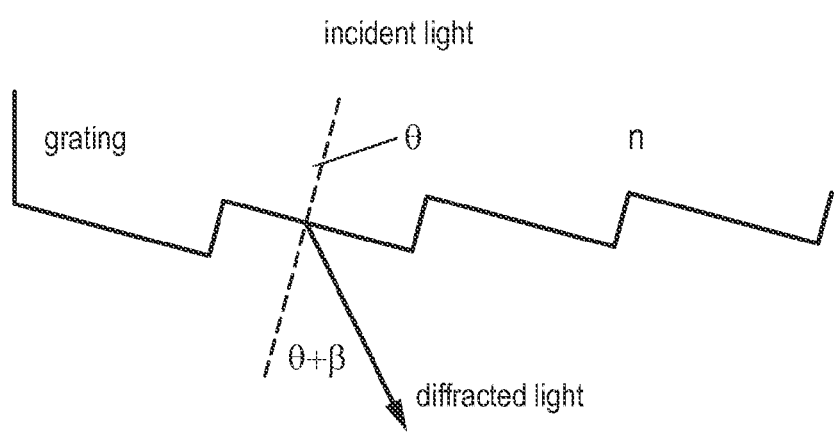
FIG. 3A is a schematic diagram showing diffraction with a grating.

This matches the angular dispersion from the DFB array combined with collimating lens. Using equations (2) and (3), and a center wavelength of 1550 nm, the value of β is calculated as 59.9°. i.e. the transmitted beam exits the grating at a nominal angle of 59.9°. The most efficient operation of the grating occurs when the refraction of the mini-prism that constitutes a groove (in the grating) lies in the same direction as the diffraction given by the grating equation. Applying Snell's Law to the interface between the groove facet and air (see FIG. 3A), the following equation holds:

$$n \sin\theta = \sin(\theta+\beta) \qquad (4)$$

where n is the refractive index of the grating material.

Combining the grating equation and Snell's law provides the relationship between the blaze angle $\beta_B$ and the groove angle θ

$$\tan\theta = \frac{\sin\beta_B}{n - \cos\beta_B} \qquad (5)$$

The transmission grating design for the preferred embodiment can be derived from the above equations.

Figure 4:
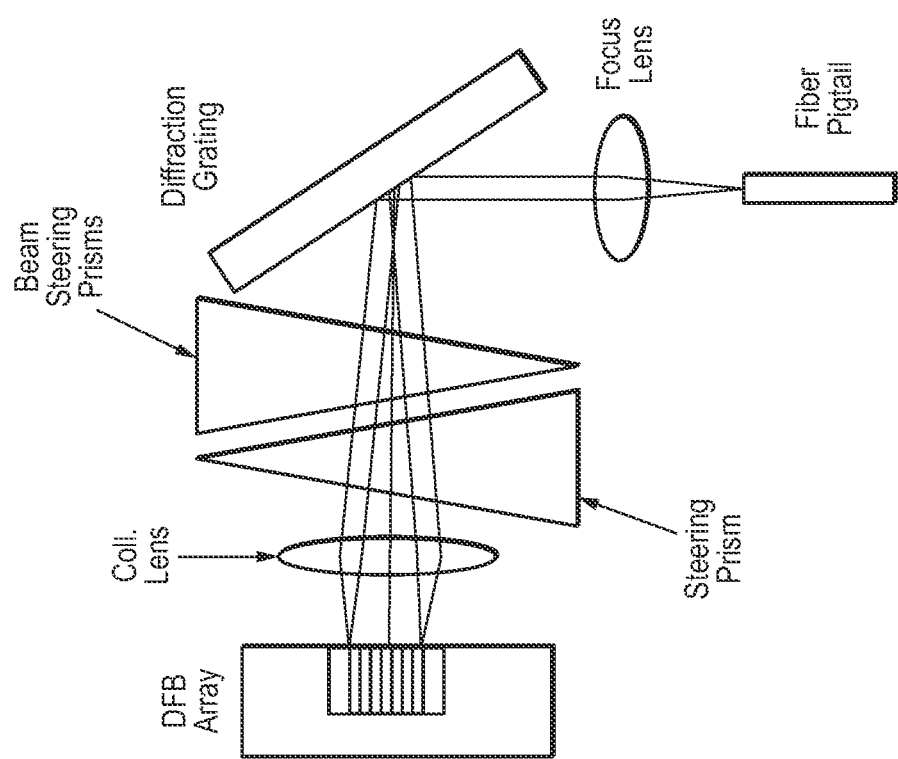
FIG. 4 is a schematic diagram showing a tunable laser with a reflection grating.

FIG. 4 shows the invention implemented with a reflection-style diffraction grating. For this implementation, a typical geometry could use an angle of incidence of 30° to the grating with a diffracted angle of around 68.5°. Beam aberration can be corrected with a prism prior to coupling to optical fiber.

The invention could also be implemented using a holographically written (formed) grating with a similar geometry to the transmission grating described above.

A modification to the preferred embodiment uses an optical beam steering prism alone (with no grating component) to compensate for spatial/spectral offset of two or more DFB array elements. In this case, the prism beam steering element is required to compensate for angular deviation of 0.2° per DFB array element. Multiplexing of up to 3 array elements should be possible with a reasonable amount of electrical power consumption for the heater and no significant degradation in coupling efficiency. This assumes that the effect of refractive index dispersion of Silicon is negligible.

In addition to thermo-optical effects which steers the direction of the beam of light we also claim the use of prisms made of electro-optic and magneto-optic materials to achieve the same. In electro-optic approach an electrical voltage could be applied to the prism (made out of materials such as $LiNbO_3$, $Sr_xBa_{1-x}Nb_2O_3$ (SBN:x) etc. The voltage can be applied to any two surfaces to induce an electro-optic index change. Similarly the prism may be made of magneto-optic materials whose effective index of refraction could be changed by applying a magnetic field to the material via a coil adjacent to the prism.

Numerous advantages of the present invention will be apparent to those skilled in the art. Among other things, the advantages of the invention include low cost, simple implementation, beam steering with no moving parts, low power consumption (related to prism size, material, etc.). These advantages lead to cost savings and performance enhancement in tunable laser systems based around the prism optical beam steering element.

Figure 5:
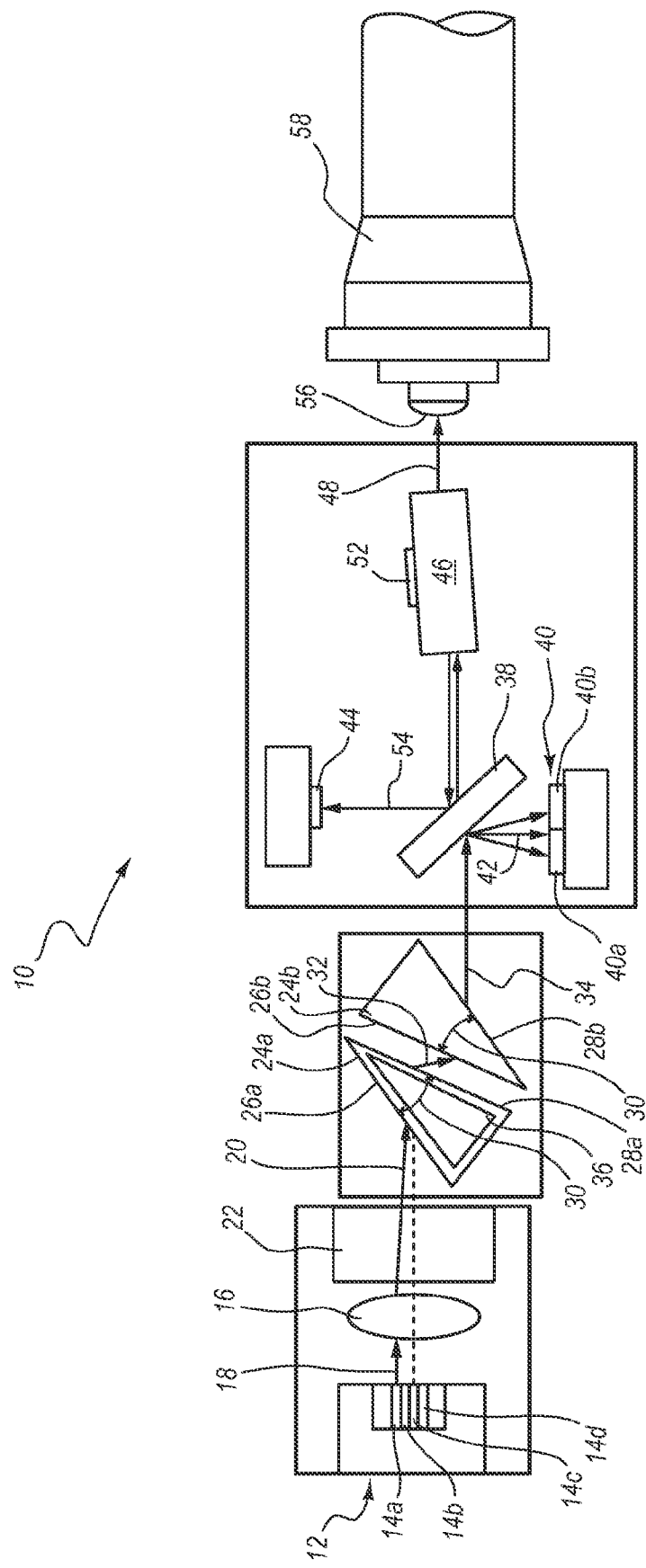
FIG. 5 is a schematic diagram showing a tunable laser with a prism beam steering element and an optical spectrum reshaper in accordance with an embodiment of the present invention.

Referring to FIG. 5, in some embodiments, a transmitter 10 includes an array 12 of lasers 14a-14d. In a preferred embodiment, the lasers 14a-14d are embodied as distributed Bragg reflector (DBR) lasers 14a-14d, each of which may have a tunable wavelength range of at least 10 nanometers. The lasers 14a-14d each have a unique wavelength. In some embodiments, the wavelength separation between the lasers 14a-14d are equal to a multiple of a nominal Δλ when no individual heating or other tuning signal is applied. However, process variations may cause the actual separation between lasers 14a-14d having adjacent nominal wavelengths to be different from Δλ by as much as 15% of Δλ, preferably less than 10% of Δλ.

In the illustrated embodiment, the lasers 14a-14d are formed on a common substrate, such as a semiconductor suitable for optical applications, such as InP. The lasers 14a-14d are parallel to one another and emit parallel to one another. Each laser 14a-14d is offset from an adjacent laser 14a-14d in a direction perpendicular to the output beams by an offset distance. As a result, the lasers 14a and 14d located on opposing ends of the array 12 are offset by a multiple of the offset between adjacent lasers.

A collimating lens 16 is positioned to receive output beams 18 from the lasers 14a and to output corresponding collimated beams 20. In the illustrated embodiment, a single collimating lens 16 is used. Due to the spatial offset of the lasers 14a-14d the collimated beams 20 are angularly shifted relative to one another and an optical axis of the collimating lens upon exiting the collimating lens 16. The angular offset may be reduced by means of a tunable prism pair discussed below. In some embodiments, an optical isolator 22 is positioned between the collimating lens 16 and the laser array 12 to reduce back reflection.

Table 1 shows examples of beam angle dependence on the focal length of the collimating lens 16. In the example of Table 1, it is assumed that the maximum lateral offset of the $4^{th}$ DBR laser element is 20 um from the optical axis of the lens.

TABLE 1

Impact of lens focal length on collimated beam angle for 20 μm lateral offset laser array

| Focal Length (mm) | Angle Tuning Requirement (deg) (assumes 20 μm offset distance) |
|---|---|
| 0.5 | 2.29 |
| 0.7 | 1.64 |
| 0.745 | 1.54 |
| 1 | 1.15 |
| 1.2 | 0.95 |

A first prism 24a and a second prism 24b may be used to correct for the difference in angles of collimated beams 20 for the different lasers 14a-14d. The first prism 24a includes an input face 26a and an output face 28a at an angle 30 with respect to one another. The input face 26a is positioned to receive the collimated beams 20 and angularly shifted beams 32 are emitted from an output face 28a.

The second prism 24b includes an input face 26b and an output face 28b at at an angle 30 with respect to one another. The angle 30 of the second prism 24b is preferably nominally equal to the angle 30 of the prism 24a, as constrained by manufacturing limitations, e.g. within 5%, preferably within 2%. The input face 26a is positioned to receive the first angularly shifted beams 32 and second angularly shifted beams 34 are emitted from the output face 28b.

The second prism 24b substantially restores the original optical beam shape and quality after the original beam has been reshaped and spread by the first prism 24a. The design of the second "correction" prism 26b can be arranged that it reduces aberration induced by the steering prism 24a while still preserving an angular shift.

In a preferred embodiment, the input face 26a of the first prism 24a is substantially parallel (e.g. within +/−2 degrees from parallel) to the output face 28b of the second prism 24b and the output face 28a of the first prism 24a is substantially parallel (e.g. within +/−2 degrees from parallel) to the input face 26b of the first prism 24b.

An index modulating element 36 is positioned on one of the first and second prisms 24a, 24b. The index modulating element 36 may be embodied as a heater or thermoelectric cooler where the prisms 24a, 24b are formed of a thermooptic material. In embodiments where the prisms 24a, 24b are formed of an electrooptic material, the index modulating element 36 may be embodied as an electrode for receiving a voltage or current. The index modulating element 36 is used to control the angle of the second angularly shifted outputs 34 in order to compensate for the spatial offset of the lasers 14a-14d.

The size of the prisms 24a, 24b may be chosen according to a focal length of the collimating lens 16. A larger focal length may advantageously reduce the difference in the angles of the collimated beams 20. However, the larger focal length may also result in a larger collimated beam size and subsequent larger aperture requirements on all the components in the optical train. Furthermore, an oblique angle of the input face 26a of the first prism 24a relative to the collimated beam 20 results in a large beam size and a corresponding large prism size. Tables 2 and 3 illustrate details of beam size and prism length. One possible configuration is an f=1 mm collimating lens 16, which is used in one embodiment.

TABLE 2

Collimated beam size for range of Lens focal length

| Focal Length (mm) | $1/e^2$ Coll beam Size (mm) (assumes 30° FFP, NA = 0.43) |
|---|---|
| 0.5 | 0.43 |
| 0.7 | 0.602 |
| 0.745 | 0.6407 |
| 1 | 0.86 |
| 1.2 | 1.032 |

TABLE 3

Length of Silicon prism vs. Collimated Beam Size

| Collimated Beam Size | Length of Silicon Prism (70° AOI) |
|---|---|
| 0.5 mm | 1.46 |
| 1 mm | 2.92 |
| 1.5 mm | 4.39 |
| 2 | 5.85 |

Performance for prisms 24a, 24b formed of silicon having a refractive index of 3.48 and temperature sensitivity of 1.8 $e^{-4}$, is outlined in Table 4, below. In Table 4, prism angle refers to the angle of the normal vector of the input face 26a of the first prism 24a relative to the optical axis of the collimating lens 16. Input angle refers to the angle between a direction of propagation of one of the collimated beams 20 relative to the same normal vector. Δn refers to the index in one of the prisms 24a, 24b in order to compensate for a given input angle and ΔT refers to the temperature change required to achieve a given Δn. As is apparent from Table 4, manageable relative coupling losses and efficiency drops may be achieved using the prism pair 24a, 24b.

TABLE 4

Prism Parameters

| Prism Angle | Input Angle | Δn | ΔT | Relative Coupling Loss % | Max Efficiency Drop % |
|---|---|---|---|---|---|
| 30 | 55 | 0.0202 | 112 | 6.00 | 2.60 |
| 30 | 60 | 0.01769 | 98 | 6.00 | 2.60 |
| 30 | 65 | 0.01492 | 83 | 7.00 | 2.80 |
| 30 | 70 | 0.0121 | 67 | 8.00 | 2.60 |
| 30 | 75 | 0.009075 | 50 | 10.00 | 2.60 |
| 30 | 80 | 0.006009 | 33 | 15.00 | 4.50 |
| 25 | 70 | 0.0145 | 81 | 9.00 | 3.50 |
| 32 | 70 | 0.01124 | 62 | 10.00 | 4.50 |
| 32 | 70 | −0.01195 | −66 | 3.00 | 2.50 |

In some embodiments, a tap splitter 38 diverts a fraction of the light in the second angularly shifted outputs 34 toward an array of first photodiodes 40. The array 40 includes two or more photodiodes 40a, 40b disposed adjacent one another along a line perpendicular to a propagation direction of the diverted beam 42 from the tap splitter 38. The amplitude of the outputs of the array 40 indicate the angle of the diverted beam 42, inasmuch as changing the angle of the beam 42 will change the amount of the beam 42 incident on each diode of the array 40. A controller receives the outputs from the array 40 and controls power supplied to the index modulating element 36 such that a ratio of the outputs conforms to a pre-calibrated value.

The portion of the second angularly shifted beam 34 that is transmitted through the tap splitter 38 is incident on an optical spectrum reshaper (OSR) 46, which outputs a filtered beam 48. The OSR 46 may be embodied as one or more filters, including, but not limited to, a single cavity filter, coupled multi-cavity (CMC) filter, a thin film coupled multi-cavity filter, a periodic multi-cavity etalon, a fiber Bragg grating, a ring resonator filter, or any other optical element having a wavelength-dependent loss. The OSR 46 may also comprise a fiber, a Gire-Tournois interferometer, or some other element with chromatic dispersion. The OSR 46 may be fabricated as a solid optical element or may include gas-filled gaps, such as an OSR 46 embodied as a periodic multi-cavity etalon. In such embodiments, xenon, or other gas may be present in the gas-filled gaps.

A portion of the light not transmitted by the OSR 46 is reflected back toward the tap splitter 38. A diverted portion 54 of the back reflected beam is incident on a second photodiode 44. The output of the photodiode 44 indicates the spectral position of the second angularly shifted beam inasmuch as the amount of reflected light is dependent on its wavelength relative to the transmission function of the OSR 46. Accordingly, a controller may receive the output of the photodiode 44 and tune the lasers 14a-14d such that a ratio of the output of the photodiode 44 and a combination of the outputs of the array of first photodiodes 40 approaches a pre-calibrated value. For example, the outputs of the first photodiodes 40 may be averaged prior to calculating a ratio of the average of the outputs of the array of first photo diodes 40 and an output of the second photodiode 44.

The output of the OSR 46 may be incident on an output lens 56 that focuses the filtered beam 48 with respect to coupling optics 58 that couple the filtered beam to an output fiber. The filtered beam 48 is then transmitted over the fiber to a receiver.

Figure 6:
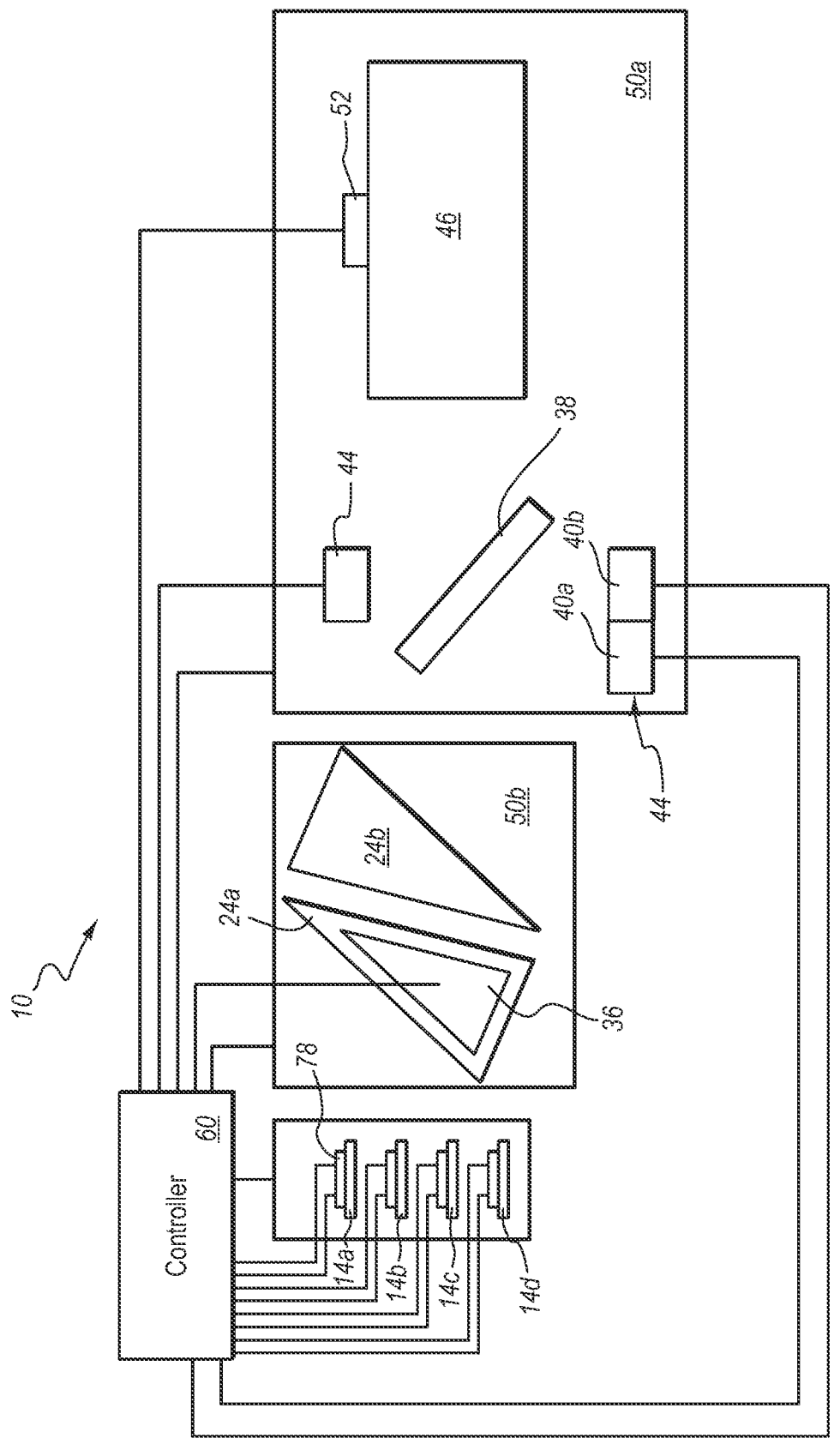
FIG. 6 is a schematic diagram illustrating a controller coupled to a tunable laser having a beam steering element and an optical spectrum reshaper in accordance with an embodiment of the present invention.

Referring to FIG. 6, a controller 60 may be electrically coupled to a thermo electric cooler (TEC) 50a on which the OSR 46 is mounted. The controller may monitor an output of the thermistor 52 in order to control power supplied to the TEC 50a, such that the temperature of the OSR 46 is driven toward a set temperature. In some embodiments, the array of first photodiodes 40, second photodiode 44, and tap splitter 38 are also mounted to the TEC 50a.

The controller 60 may also be electrically coupled to a second TEC 50b on which the prisms 24a, 24b are mounted. The controller 60 may control current supplied to the TEC 50b to compensate for changes in environmental temperature and to tune the angular shift of the prisms 24a, 24b.

Referring to FIG. 7, while still referring to FIG. 6, the OSR 46 preferably has a periodic transmission function represented by line 62 having a number of transmission peaks with various transmission edges. In some applications, the outputs 18 of the lasers 14a-14d may be frequency modulated. In some embodiments, the outputs 18 are both frequency and amplitude modulated. In either case, the outputs 18 may include frequency excursions from a base frequency to a peak frequency, with the excursions encoding digital data. In some modulation formats, data may be encoded in the phase of the peak frequency portions such that the frequency excursions do not encode data, but rather separate individual bits.

As shown in FIG. 7, an output signal may have a signal frequency pair 64 having a base frequency 66 and a peak frequency 68. The transmission function has lower transmission at the base frequency 66 than at the peak frequency 68. The filtered signal 48 output by the OSR 46 will therefore have an increased extinction ratio relative to the outputs 18.

In order to perform the filtering function with respect to the signal frequency pair 70, the transmission function may be shifted such that the transmission function is represented by dotted line 72. The base frequency 74 and peak frequency 76 are therefore located on a transmission edge with the base frequency 74 experiencing greater attenuation.

Wide tunability of the transmitter 10 may therefore be accomplished by tuning one of the transmission edges of the OSR 46 such that one or both of a desired base and/or peak frequency lie thereon, or the transmission edge lies therebetween. One of the lasers 14a-14d having the desired base and peak frequency within its tuning range may then be tuned such that frequency modulated signals emitted therefrom have frequency excursions between the base and peak frequency.

Referring again to FIG. 6, the controller 60 may be programmed to receive or calculate a set frequency at which the transmitter 10 is to output optical signals. The set frequency may represent either the base frequency, peak frequency, or some intermediate value. The controller 60 may then consult a calibration table or function to determine a temperature of the OSR 46, or output of the thermistor 52, at which the OSR 46 has a transmission edge including the set frequency. The controller 60 then drives the TEC 50a until the output of the thermistor 52 is equal to the calibrated value corresponding to the set frequency. The controller 60 may also select one of the lasers 14a-14d having the set frequency within its tuning range. The controller 60 may then power the selected laser. The controller 60 receives outputs from the array of first photodiodes 40. The controller 60 drives power supplied to the index modulating element 36 such that the outputs of the array of first photodiodes 40 indicate that the second angularly shifted beam 34 is at a proper angle to be incident on the output lens 56.

The controller 60 also receives an output from the second photodiode 44. The controller may be programmed to calculate a ratio of the output of the second photodiode 44 and a combination of the outputs of the array of first photodiodes 40, such as an average. The controller 60 may drive power supplied to stripe heaters 78 such that the ratio of the outputs approaches a pre-calibrated value indicating that the base or peak frequency of the selected laser is equal to or within a predetermined offset amount from the set frequency.

The above mentioned steps of making adjustments to operation of the transmitter 10 according to outputs of the thermistor 52, array of first photodiodes 40, and the second photodiode 44 may be performed continuously during operation of the transmitter 10.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical transmitter comprising:
    a laser array comprising a plurality of lasers spatially offset from one another and each having a laser output having a unique wavelength;
    a first prism positioned to impart a first angular shift to the laser outputs to produce first angularly shifted outputs propagating in a first direction;
    a second prism positioned to impart a second angular shift to the first angularly shifted outputs propagating in the first direction to produce second angularly shifted outputs propagating in a second direction, wherein the second angular shift is in a direction opposite the first angular shift, wherein the second prism includes an input face and an output face different than the input face, the input face positioned to receive the first angularly shifted outputs from the first prism;
    a lens positioned to receive, from the output face of the second prism, a first output of the second angularly shifted outputs incident on the lens, wherein the lens is configured to focus the second angularly shifted outputs received from the output face of the second prism for output to an optical fiber;
    an index modulating element coupled to one of the first and second prisms;
    a controller electrically coupled to the index modulating element, the controller programmed to selectively power the index modulating element an amount effective to alter one of the first and second angular shifts sufficiently to cause a second output of the second angularly shifted outputs to be incident on the lens; and
    an optical spectrum reshaper positioned between the second prism and the optical fiber, the optical spectrum reshaper having at least one transmission edge aligned with the wavelength of at least one of the lasers.

2. The optical transmitter of claim 1, wherein the index modulating element is a heater.

3. The optical transmitter of claim 1, wherein:
    the first prism includes an input face and an output face;
    the input face of the first prism is positioned to receive the laser outputs;
    the output face of the first prism is positioned to output the first angularly shifted outputs;
    the input face of the second prism is positioned to receive the first angularly shifted outputs from the output face of the first prism;

the output face of the second prism is positioned to output the second angularly shifted outputs; and the input face of the first prism is parallel to the output face of the second prism and the output face of the first prism is parallel to the input face of the second prism.

4. The optical transmitter of claim 3, wherein the input face of the first prism is at a non-perpendicular angle relative to a propagation direction of the laser outputs.

5. The optical transmitter of claim 1, wherein the plurality of lasers comprise distributed Bragg reflector (DBR) lasers.

6. The optical transmitter of claim 5, wherein the DBR lasers have a tunable wavelength range of at least 10 nanometers.

7. The optical transmitter of claim 1, further comprising an optical isolator positioned between the first prism and the laser array.

8. The optical transmitter of claim 1, wherein the second prism is arranged to reverse an aberration introduced by the first prism.

9. An optical transmitter comprising:
- a laser array comprising a plurality of lasers spatially offset from one another and each having a laser output having a unique wavelength;
- a first prism positioned to impart a first angular shift to the laser outputs to produce first angularly shifted outputs;
- a second prism positioned to impart a second angular shift to the first angularly shifted outputs to produce second angularly shifted outputs, the second angular shift in a direction opposite the first angular shift;
- a lens positioned to receive a first output of the second angularly shifted outputs incident on the lens;
- an index modulating element coupled to one of the first and second prisms;
- a controller electrically coupled to the index modulating element, the controller programmed to selectively power the index modulating element an amount effective to alter one of the first and second angular shifts sufficiently to cause a second output of the second angularly shifted outputs to be incident on the lens;
- an optical fiber positioned to receive an output of the lens;
- an optical spectrum reshaper positioned between the second prism and the optical fiber, wherein the optical spectrum reshaper has at least one transmission edge aligned with the wavelength of at least one of the lasers;
- an array of first photodiodes;
- a second photodiode; and
- a tap splitter positioned between the second prism and the optical spectrum reshaper and configured to divert a portion of the second angularly shifted outputs onto the array of first photodiodes and configured to divert a portion of light reflected from the optical spectrum reshaper onto the second photodiode;
- wherein the controller is electrically coupled to the array of first photodiodes and is programmed to control power supplied to the index modulating element according to outputs of the array of first photodiodes; and
- wherein the controller is electrically coupled to the plurality of lasers and is operable to control the wavelengths of the plurality of lasers according to a ratio of an output of the second photodiode and a combination of the outputs of the array of first photodiodes.

10. The optical transmitter of claim 9, further comprising a temperature sensor and a heat modulating element in thermal contact with the optical spectrum reshaper; wherein the controller is electrically coupled to the temperature sensor and heat modulating element and programmed to supply power to the heat modulating element effective to maintain an output of the temperature sensor at a set operating point.

11. The optical transmitter of claim 10, wherein the heat modulating element is a thermoelectric cooler.

12. The optical transmitter of claim 10, wherein the controller stores an operating wavelength and wherein the controller is programmed to choose the set operating point of the temperature sensor corresponding to the operating wavelength.

13. The optical transmitter of claim 10, wherein the set operating point of the temperature sensor corresponding to the operating wavelength is the output of the temperature sensor at which the optical spectrum reshaper is tuned to have a transmission edge within a predetermined offset distance from the operating wavelength.

14. The optical transmitter of claim 13, wherein the optical spectrum reshaper has periodic transmission edges.

15. An optical transmitter comprising:
- a laser array comprising a plurality of lasers spatially offset from one another and each having a laser output having a unique wavelength;
- a first prism positioned to impart a first angular shift to the laser outputs to produce first angularly shifted outputs propagating in a first direction;
- a second prism positioned to impart a second angular shift to the first angularly shifted outputs propagating in the first direction to produce second angularly shifted outputs propagating in a second direction, wherein the second angular shift is in a direction opposite the first angular shift;
- a lens positioned to receive a first output of the second angularly shifted outputs incident on the lens;
- an index modulating element coupled to one of the first and second prisms; and
- a controller electrically coupled to the index modulating element, the controller programmed to selectively power the index modulating element an amount effective to alter one of the first and second angular shifts sufficiently to cause a second output of the second angularly shifted outputs to be incident on the lens, wherein:
- the optical transmitter defines a one-way optical signal path from the laser array through the first and second prisms;
- the plurality of lasers comprises distributed Bragg reflector (DBR) lasers; and
- the DBR lasers have a tunable wavelength range of at least 10 nanometers.

16. The optical transmitter of claim 15, wherein:
- the second prism includes an input face and an output face different than the input face;
- the lens is positioned to receive the second angularly shifted outputs from the output face of the second prism; and
- the lens is configured to focus the second angularly shifted outputs received from the second prism for output to an optical fiber.

17. The optical transmitter of claim 15, wherein the index modulating element comprises a heater or a thermoelectric cooler.

18. An optical transmitter comprising:
- a laser array comprising a plurality of lasers spatially offset from one another and each having a laser output having a unique wavelength;
- a first prism positioned to impart a first angular shift to the laser outputs to produce first angularly shifted outputs propagating in a first direction;

a second prism positioned to impart a second angular shift to the first angularly shifted outputs propagating in the first direction to produce second angularly shifted outputs propagating in a second direction, wherein the second angular shift is in a direction opposite the first angular shift, wherein the second prism includes an input face and an output face different than the input face, the input face positioned to receive the first angularly shifted outputs from the first prism;

a lens positioned to receive, from the output face of the second prism, a first output of the second angularly shifted outputs incident on the lens, wherein the lens is configured to focus the second angularly shifted outputs received from the output face of the second prism for output to an optical fiber;

an index modulating element coupled to one of the first and second prisms;

a controller electrically coupled to the index modulating element, the controller programmed to selectively power the index modulating element an amount effective to alter one of the first and second angular shifts sufficiently to cause a second output of the second angularly shifted outputs to be incident on the lens; and an optical isolator positioned between the first prism and the laser array.

19. The optical transmitter of claim 18, wherein the index modulating element comprises a heater or a thermoelectric cooler.

20. The optical transmitter of claim 18, wherein the index modulating element comprises an electrode.

* * * * *